SOLID STATE TUNED AMPLIFIER

Filed June 27, 1969

HARRY F. PAUL
INVENTOR

BY Nicholas A. Pandiscio
ATTORNEY

United States Patent Office 3,551,835

Patented Dec. 29, 1970

3,551,835

SOLID STATE TUNED AMPLIFIER

Harry F. Paul, Belmont, N.H., assignor to Tram Corporation, Winnisquam, N.H., a corporation of New Hampshire Filed June 27, 1969, Ser. No. 837,102

Int. Cl. H03f *1/14*

U.S. Cl. 330—27 10 Claims

ABSTRACT OF THE DISCLOSURE

A tuned field effect transistor amplifier that provides exceptionally high amplification with minimum distortion of phase or frequency. The input signal is applied to the source electrode and novel resonant circuit means between the source and gate electrodes provide in response to the input signal a voltage change at the gate electrode which increases the total signal gain.

This invention pertains to amplifiers and more particularly to a novel solid state tuned amplifier adapted to provide exceptionally high gain.

As is well known, tuned amplifiers commonly are used where it is desired to provide a signal amplification of a selected frequency or within a narrow band of frequencies. A typical use is in a tuned radio frequency receiver. The usual method of tuning an amplifier is to provide a resonant tuned circuit as a load impedance or as part of the circuit by which the amplifier is coupled to a preceding state, the tuned circuit determining the frequency or band of frequencies to be selectively amplified. An important consideration in the design of the tuned amplifier is the need to prevent undue phase or frequency distortion by the resonant circuit.

The object of the present invention is to provide a novel tuned solid state amplifier which provides exceptionally high amplification of a selected relatively narrow band of frequencies without any material distortion of phase or frequency and which may be constructed at a cost which is relatively low in comparison to the gain and stability which it affords.

Still another object is to provide a very high gain tuned amplifier that is especially adapted for use in radio receivers, e.g., in the I.F. stage of a radio receiver where the I.F. amplifier must have an operating hand of about 10 kHz. with a center frequency of 455 kHz.

Other objects and many of the attendant advantages of the present invention will become more readily apparent from the following detailed specification when considered together with the accompanying drawing wherein.

Figures 1, 2, 3:
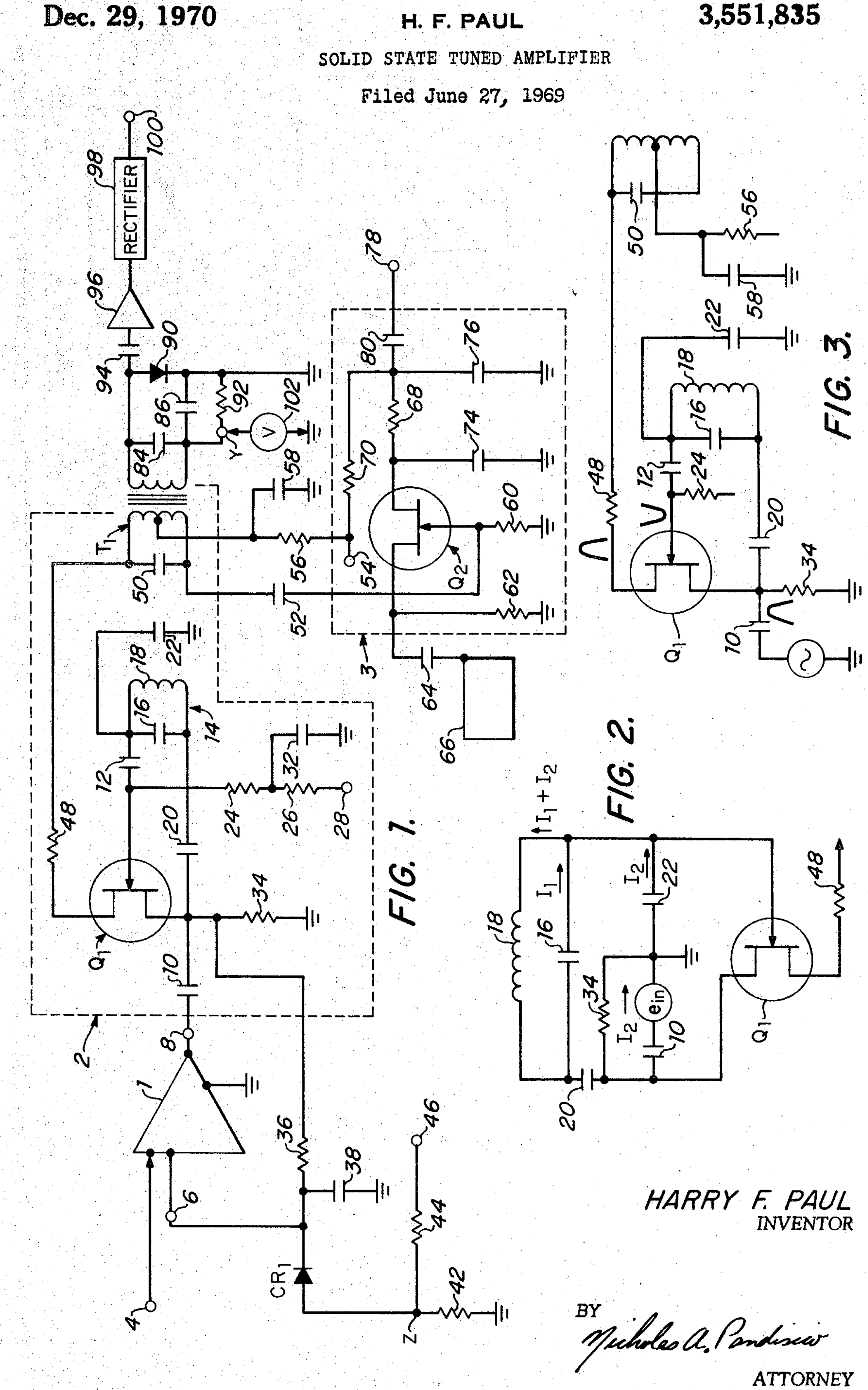
FIG. 1 is a diagram of several stages of a single sideband radio receiver which includes a preferred embodiment of the invention adapted to function as a tuned I.F. amplifier.
FIG. 2 is a rearrangement of the circuit of the tuned I.F. amplifier stage.
FIG. 3 shows voltage phase relationships in the tuned I.F. amplifier stage.

Turning now to the drawings, the illustrated circuit comprises a noninverting wide band amplifier 1 adapted for automatic gain control, a tuned I.F. amplifier 2 constructed in accordance with this invention and also adapted for automatic gain control, and an audio detector 3. The wideband amplifier 1, which is characterized by a relatively low output impedance, has an input signal terminal 4, an automatic gain control voltage input terminal 6, and an output terminal 8. The input signal is applied between input terminal 4 and ground and the output signal is taken between output terminal 8 and ground. In the illustrated embodiment the amplifier 1 is of a type which requires a positive bias voltage between terminal 6 and ground.

By way of example but not limitation, the amplifier 1 may be an integrated circuit device such as the low-power wideband amplifier integrated circuit device sold by Radio Corporation of America under the designation CA3021. The terminal pins 1, 2 and 8 of the type CA3021 integrated circuit amplifier correspond to the terminals 4, 6 and 8 respectively shown in FIG. 1 and the ground connection is made by way of terminal pins 11 and 12. Amplifier 1 has its greatest gain when the positive potential between terminal 6 and ground is maximum, so that a decrease in this bias voltage decreases the gain of amplifier 1.

The tuned amplifier 2 comprises a field effect transistor ("F.E.T.") $Q_1$ whose source electrode is coupled to the output terminal 8 of the wideband amplifier 1 by way of a coupling capacitor 10. The gate electrode of $Q_1$ is connected to the source electrode by way of a capacitor 12 connected in series with a parallel LC circuit 14 (which comprises a capacitor 16 and an inductance 18) and a capacitor 20. The junction of capacitor 12 and the LC circuit 14 is connected to ground by a capacitor 22. Capacitors 12 and 20 provide D.C. isolation. Capacitor 20 may be omitted if capacitor 12 provides desired D.C. isolation. The capacitor 20 is very large compared to capacitor 22 so that its effect on tuning is minimum. The capacitor 22 provides capacitance to ground so as to enable a voltage rise in the LC circuit. The gate of $Q_1$ also is connected by way of a pair of series resistors 24 and 26 to a second automatic gain control input terminal 28. The automatic gain control signal applied to terminal 28 has a negative polarity and its source is described below. An A.C. bypass or decoupling capacitor 32 connects the junction of resistors 24 and 26 to ground. Capacitor 32 and resistor 26 function as an audio filter to remove any audio signal appearing at the A.G.C. terminal 28.

The source electrode of transistor $Q_1$ is connected to ground by a resistor 34; it is also connected to terminal 6 of the wideband amplifier 1 by way of a resistor 36. A capacitor 38 connects the same terminal to ground. Terminal 6 also is connected by a diode $CR_1$ to the junction of a pair of resistors 42 and 44 which forms a voltage divider network connected between ground and a terminal 46. The latter terminal is connected to a source of positive D.C. voltage.

The drain electrode of the F.E.T. transistor $Q_1$ is connected by a resistor 48 to one end of the primary coil of transformer $T_1$. A tuning capacitor 50 is connected across the primary of transformer $T_1$. The other end of the primary of transformer $T_1$ is connected to the audio detector 3 by means of a coupling capacitor 52. A positive bias voltage for the drain of $Q_1$ is achieved by connecting a center tap on the primary of $T_1$ to a terminal 54 by way of a dropping resistor 56. Terminal 54 is connected to a positive D.C. voltage source. An A.C. bypass capacitor 58 is connected between ground and the center tap of $T_1$.

The audio detector comprises a second F.E.T. transistor Q2 whose gate electrode is connected to coupling capacitor 52. The gate of Q2 also is connected to ground by a resistor 60. The source of Q2 is connected to ground by a resistor 62; it is also connected by means of a couping capacity 64 to the output terminal of a beat frequency oscillator 66. A positive bias voltage is applied to the drain of Q2 by connecting the latter to terminal 54 by way of a voltage divider network consisting of a pair of resistors 68 and 70.

A capacitor 74 is connected between the drain of Q2 and ground. Another A.C. bypass capacitor 76 is connected between ground and the junction of resistors 68 and 70. Capacitors 74 and 76 and resistor 68 form an audio pass filter. The junction of resistor 68 and 70 also is connected to an audio output terminal 78 through a coupling capacitor 80.

The secondary of transformer T1 is connected to a circuit for producing a negative polarity automatic gain control voltage for the tuned amplifier 2. As shown in the drawing, the secondary coil of transformer T1 is shunted by a tuning capacitor 84 and is connected in series with a capacitor 86 and a diode 90. A resistor 92 is connected in parallel with capacitor 86. The junction of capacitor 86 and resistor 92* with diode 90 is connected to ground. The upper end of the secondary coil of the transformer is connected by a coupling condenser 94 and an amplifier 96 to a rectifier 98. The latter is arranged in a manner well known to those skilled in the art to provide in response to its input a negative D.C. voltage appearing at its output terminal 100. The latter is connected (by a lead wire not shown) to the automatic gain control voltage input terminal 28.

Considering now solely the tuned I.F. amplifier 2, the capacitor 16 and inductor 18 have values of capacitance and inductance respectively such that the LC circuit 14 has a resonant frequency which is higher than the desired operating I.F. frequency and the capacitors 12, 20 and 22 have values selected so that together with capacitor 16 and inductor 18 they provide a circuit between the source and gate of $Q_1$ that is resonant at the desired operating I.F. frequency. The tuned amplifier inverts the signal output of wideband amplifier 1 and selectively amplifies that portion of the signal output which is at the desired operating I.F. frequency. Because of the tuned circuit components (capacitor 16, inductance 18, capacitors 12, and 22, and the input capacitance of the F.E.T. connecting the gate and source electrodes), the signal voltage applied to the source electrode generates a voltage at the gate which is 180 degrees out of phase with the signal voltage and the potential difference between the gate and source electrodes changes by an amount greater than the signal voltage; this interelectrode voltage change is amplified by $Q_1$. Accordingly, a total gain results which is greater than the gain that would result if the tuned circuit were omitted from the circuit of $Q_1$. Essentially the total gain is product of the gain of $Q_1$ and an additional gain produced by the resonant circuit which consists of the LC circuit 18 and the capacitors 12, 20 and 22 plus an increase in effective signal voltage due to drain current flow in resistor 34. The flow of drain current in resistor 34 develops a voltage which is in phase with the signal voltage. Disregarding for a moment the operation of the resonant circuit and assuming no change in gate voltage, an increase in the amplitude of the output of wideband amplifier 1 has the effect of raising the potential of the source electrode and diminishing the potential difference between the drain and source, so that $Q_1$ will conduct less; conversely a decrease in the amplitude of the output of amplifier 1 will have the effect of causing $Q_1$ to conduct more. If at the time that the potential of the source electrode is changing in one direction relative to the drain electrode, e.g., in a positive direction, the potential of the gate electrode shifts in the opposite direction, the change in conduction of $Q_1$ will be even greater than it would be if the gate voltage did not change. Accordingly by providing a resonant circuit adapted to produce a change in the potential of the gate electrode substantially 180° out of phase with respect to and in response to a change in the potential of the source electrode, the amplifier 2 is caused to provide a gain greater than would be the case due solely to the change in source electrode potential.

How the tuned circuit manages to cause the gate potential to undergo a change substantially 180° out of phase with respect and in response to a change in source potential is not known with certainty. What appears to be the best explanation is as follows with respect to FIG. 2 which shows the circuit for $Q_1$ rearranged to indicate a tap which is not otherwise clear from FIG. 1. The symbol $e_{in}$ designates the signal source. As shown in FIG. 2 the current $I_2$ starting from ground leads the signal voltage by 90° and flows through inductance 18 to the junction of resistor 34 and capacitor 10 back to ground. The angle of lead of current $I_2$ through resistor 34 and capacitor 10 is less than 90° with respect to the signal voltage and is dependent on the relative magnitudes of resistor 34 and capacitor 10 and the internal signal source impedance. The lead through resistor 34 and capacitor 10 is close to 90°, making a total shift of close to 180° between the gate and source electrodes. In practice capacitor 22 is selected to have a reactance many times greater than the combined impedance of resistor 34 and capacitor 10, so that the voltage across capacitor 22 is much greater than the voltage across resistor 34 and capacitor 10. As an optional feature, capacitor 16 may be omitted and the values of capacitors 10 and 22 and resistor 34 altered to effect an appropriate change in gain.

FIG. 3 shows part of FIG. 1 modified to indicate voltage phase relationships on the positive half of the input signal. The source voltage is positive, the gate voltage is negative and the drain voltage is positive. The drain voltage is in phase with the input signal voltage and, because the drain load, the F.E.T. and the source resistance are in series, a portion of the output voltage adds in phase with the input voltage so as to produce a further increase in gain. The gain of the stage shown in FIG. 3 is dependent upon the drain load impedance, the impedance of the gate-to-source circuit, the value of resistor 34 and the normal gain of the F.E.T. Essentially the invention causes the stage to function as a gain multiplier since the gain of the circuit is the voltage rise across resistor 34, the voltage rise in the circuit between the source and gate, and the normal gain of the F.E.T. The circuit's voltage gain is represented as follows:

$$e_0 = (e_{34})(_{s-g})\left(g_m \frac{R_o R_L}{R_o + R_L}\right)(e_g)$$

where $e_o$ is the output signal voltage, $e_g$ is the input signal voltage, $e_{34}$ is the voltage gain across resistor 34, $\epsilon_{s-g}$ is the voltage gain in the circuit between the source and gate, $g_m$ is the transconductance of the F.E.T., $R_o$ is the output impedance of the F.E.T., and $R_L$ is the drain load impedance. Hence if the voltage rise $e_{34}$ is 2, the voltage rise $e_{s-g}$ is 30 and the normal gain of the F.E.T. with the given load (represented as $$g_m \frac{R_o R_L}{R_o + R_L}$$

in the above formula) is 10, then $$e_o = (2)(30)(10)e_g$$

or $$e_o = 600e_g$$

Operation of the system shown in FIG. 1 will now be described with respect to an audio-modulated R.F. input signal voltage applied to input terminal 4. This signal is amplified by wideband amplifier 1 and then applied to the source electrode of transistor $Q_1$ of the tuned amplifier 2. Due to the action of the resonant circuit as previously described, the change in the potential of the source electrode of $Q_1$ is accompanied by an opposite change in potential at the gate electrode in response to signals at the selected I.F. frequency to which amplifier 2 is tuned. The magnitude of the change in potential at the gate electrode is determined by the parameters of the resonant circuit. The output of the tuned amplifier 2 is applied to the audio detector circuit 3 where it is heterodyned with the output of oscillator 66 to generate a beat frequency signal which is processed by the audio pass filter (capacitors 74 and 76 and resistor 68) to effect recovery of the audio signal at terminal 78. The latter terminal is connected directly, or through an audio amplifier, to a suitable speaker system.

The output from tuned amplifier 2 is also used to generate an automatic gain control signal at terminal 100 which is applied to $Q_1$ via terminal 28; the I.F. signal appearing across the secondary of $T_1$ is amplified by amplifier 96 and then rectified by rectifier 98 which is arranged to produce at terminal 100 a negative D.C. signal output which increases (not linearly) with increasing I.F. signal amplitude. The less negative the A.G.C. voltage appearing at terminal 100 and applied to terminal 28, the heavier $Q_1$ tends to conduct and the greater the signal input to $Q_1$ is amplified. This in turn causes the A.G.C. voltage to become more negative which in turn causes $Q_1$ to conduct less. In practice the circuit is arranged preferably so that $Q_1$ is saturated when the A.G.C. voltage is zero.

The diode 90 and resistor 92 provide a detector circuit whereby the I.F. current through the secondary of transformer $T_1$ develops a D.C. voltage across resistor 92 which is proportional to the I.F. signal amplitude. This voltage is measurable by means of a D.C. voltmeter 102 connected between point *y* and ground. A voltmeter so connected makes it possible to determine the amount of gain achieved by tuned amplifier 2.

With respect to the wide-band amplifier 1, it is subject to automatic gain control by the voltage developed across resistor 34. When the automatic gain control voltage applied at terminal 28 goes more negative so as to reduce the gain of $Q_1$, the voltage across resistor 34 drops, i.e., it becomes less positive. This voltage is fed back via resistor 36 and terminal 6 to decrease the gain of amplifier 1. When the A.G.C. voltage applied to the gate of $Q_1$ via terminal 28 is minimum, i.e., at or near zero, $Q_1$ is saturated and the voltage across resistor 34 is maximum, with the result that wideband amplifier 1 is caused to operate at maximum gain. Normally the positive voltage at terminal 6 is high enough to prevent diode CR1 from conducting. However, if the voltage at terminal 6 drops below the level of the bias voltage at point *z*, diode CR1 will conduct and thereby clamp terminal 6 to the voltage at point *z*. Hence the positive voltage at terminal 6 is prevented from reaching zero. Such clamping action is essential to avoid overloading the wideband amplifier 1. Resistor 36 has a value such as to prevent current flow back to the source electrode of $Q_1$ when diode CR1 is conducting. This blocking action is essential since backflow of current to the source electrode would change the apparent voltage across resistor 34 and thereby change the bias on $Q_1$.

It is to be noted that some I.F. voltage tends to appear across resistor 34. Accordingly it is necessary to filter such voltage so that it will not appear at terminal 6 and thereby cause amplifier 1 to go into oscillation. This is accomplished by capacitor 38 and resistor 36 which act as an I.F. pass filter.

With respect to tuned amplifier 2, capacitor 22 is small and serves to conduct A.C. current to ground and thereby cause a voltage rise across LC circuit 14. Capacitor 12 provides D.C. isolation. It is required because the gate source input capacitance tends to detune the LC circuit. Capacitor 12 tends to minimize the effect of a change in *g-s* (gate-source) input capacitance. Capacitor 20 is large compared to capacitor 22 so that its effect on tuning is minimal. Capacitor 20 is essentially a D.C. blocking capacitor. Capacitor 32 functions together with resistor 26 to remove audio signals appearing at the A.G.C. terminal 28.

In practice the invention has been used in a single side band receiver designed to operate with an I.F. signal frequency of 455 kc. In such receiver the local beat frequency oscillator 66 was aranged to be switched so that its output was either 455 kc.+4 kc. or 455 kc.−4 kc. By way of example but not limitation with respect to the gain provided by tuned amplifier 2, in operating such single band receiver it was determined that an input signal change of 1,000 microvolts at the source of $Q_1$ resulted in a 1 volt change in the voltage appearing at point *y*, as measured by a D.C. voltmeter.

It is to be understood that the invention is not limited in its application to the details of construction and arrangement of parts specifically described or illustrated, and that within the scope of the appended claims, it may be practiced otherwise than as specifically described or illustrated.

What is claimed is:

1. A high gain tuned I.F. amplifier comprising:

a field effect transistor having a drain electrode, a source electrode and a gate electrode;

a resistor connecting said source electrode to ground;

means for applying an input signal in the form of an audio modulated I.F. signal voltage of predetermined frequency to said source electrode, signal responsive means connected between said source and gate electrodes comprising an LC circuit having a resonant frequency near to but higher than said predetermined frequency and capacitive means for minimizing the effect of a change in gate-source input capacitance on the resonant frequency of said LC circuit, said signal responsive means forming a tuned circuit between said source and gate electrodes that is resonant at said predetermined frequency; and means connected to said drain electrode for recovering said input signal as amplified by said transistor.

2. A tuned I.F. amplifier according to claim 1 wherein said capacitive means comprises a capacitor connecting said LC circuit to said gate electrode.

3. A tuned I.F. amplifier according to claim 2 further including a capacitor connected on one side to ground and on the other side to the junction of said first-mentioned capacitor and said LC circuit.

4. A tuned I.F. amplifier according to claim 1 further including capacitive means for causing a voltage rise across said LC circuit in response to application of said input signal to said source electrode.

5. A tuned I.F. amplifier according to claim 1 further including means for deriving from said amplified input signal negative D.C. voltage signal that varies with the amplitude of said amplified signal, and means for applying said negative D.C. voltage to said gate electrode to vary the voltage on said gate electrode and thereby control the gain of said amplifier.

6. A tuned I.F. amplifier according to claim 1 in combination with another amplifier for producing said input signal, said means for applying said input signal to said source electrode being connected to the output terminal of said another amplifier, means for deriving from said tuned I.F. amplifier a control voltage varying in accordance with the voltage of said source electrode, and means for applying said control voltage to said another amplifier so as to vary its gain in response to the amplitude of said control voltage.

7. The combination of claim 1 wherein said control voltage is applied to an input terminal of said another amplifier, and further including clamping means for preventing the voltage at said input terminal from falling below a predetermined minimum level.

8. A tuned amplifier according to claim 1 wherein said capacitive means for minimizing the effect of a change in gate-source input capacitance on the resonant frequency of said LC circuit comprises a capacitor connected between said LC circuit and said gate electrode, and further wherein said signal responsive means includes another capacitor connected between said source electrode and said LC circuit and still another capacitor connected between ground and the junction of said LC circuit and said capacitor connecting said LC circuit to said gate electrode.

9. A tuned high gain amplifier for amplifying a modulated intermediate frequency A.C. signal voltage comprising:

a field effect transistor having a source electrode, a drain electrode and a gate electrode;

a resistor directly connecting said source electrode to ground;

means including a coupling capacitor for applying said signal voltage to said source electrode;

signal responsive means directly connected between said source and gate electrode said signal responsive means comprising inductive and capacitive elements connected to form a circuit that is tuned to the frequency of said signal voltage and responds to changes in amplitude of the voltage at said source electrode by producing opposite direction changes in gate voltage amplitude, whereby the drain current is amplified according to the product of the gain produced by the signal voltage at said source electrode and the gain produced by said gate electrode voltage, and means providing a circuit for said drain current.

10. A tuned high gain amplifier according to claim 9 further including means for deriving a D.C. voltage that varies with changes in amplitude of said drain current, and means for applying said D.C. voltage to said gate electrode.

References Cited

UNITED STATES PATENTS

| | | | |
|---|---|---|---|
| 2,691,074 | 10/1954 | Eberhard | 330—27X |
| 3,229,120 | 1/1966 | Carlson | 330—38UX |
| 3,404,347 | 10/1968 | Kaplan et al. | 330—38X |

ROY LAKE, Primary Examiner

J. B. MULLINS, Assistant Examiner

U.S. Cl. X.R.

330—29, 35

UNITED STATES PATENT OFFICE

CERTIFICATE OF CORRECTION

Patent No. 3,551,835 Dated December 29, 1970

Inventor(s) Harry F. Paul

It is certified that error appears in the above-identified patent and that said Letters Patent are hereby corrected as shown below:

Column 4, lines 35 to 37, the formula should appear as sh below:

$$e_o = (e_{34})(e_{s-g})\left(g_m \quad \frac{R_o R_L}{R_o + R_L}\right)(e_g)$$

Signed and sealed this 4th day of May 1971.

(SEAL)
Attest:

EDWARD M.FLETCHER,JR.
Attesting Officer

WILLIAM E. SCHUYLER,
Commissioner of Pate